United States Patent
Udayakumar et al.

(10) Patent No.: US 6,982,448 B2
(45) Date of Patent: Jan. 3, 2006

(54) FERROELECTRIC CAPACITOR HYDROGEN BARRIERS AND METHODS FOR FABRICATING THE SAME

(75) Inventors: K. R. Udayakumar, Dallas, TX (US); Theodore S. Moise, Dallas, TX (US); Scott R. Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/803,445

(22) Filed: Mar. 18, 2004

(65) Prior Publication Data

US 2005/0205906 A1  Sep. 22, 2005

(51) Int. Cl.
*H01L 29/76* (2006.01)
*H01L 29/94* (2006.01)
(52) U.S. Cl. .................. 257/295; 257/303; 257/306
(58) Field of Classification Search ............... 257/295, 257/301–313; 438/3, 243, 244, 253, 386, 438/387, 396, 399
See application file for complete search history.

(56) References Cited

U.S. PATENT DOCUMENTS

| | | | |
|---|---|---|---|
| 5,452,178 A | 9/1995 | Emesh et al. | |
| 5,825,068 A | 10/1998 | Yang | |
| 5,972,722 A | 10/1999 | Visokay et al. | |
| 6,090,697 A | 7/2000 | Xing et al. | |
| 6,144,060 A | 11/2000 | Park et al. | |
| 6,177,351 B1 | 1/2001 | Beratan et al. | |
| 6,225,656 B1 | 5/2001 | Cuchiaro et al. | |
| 6,242,299 B1 | 6/2001 | Hickert | |
| 6,261,967 B1 | 7/2001 | Athavale et al. | |
| 6,291,251 B1 | 9/2001 | Nam | |
| 6,355,952 B1 | 3/2002 | Yamoto et al. | |
| 6,365,927 B1 | 4/2002 | Cuchiaro et al. | |
| 6,423,592 B1 | 7/2002 | Sun | |
| 6,495,413 B2 | 12/2002 | Sun et al. | |
| 6,512,256 B1 | 1/2003 | Cuchiaro et al. | |
| 6,528,386 B1 | 3/2003 | Summerfelt et al. | |
| 6,534,809 B2 * | 3/2003 | Moise et al. ............... | 257/295 |
| 6,576,482 B1 | 6/2003 | Aggarwal et al. | |
| 6,576,942 B2 | 6/2003 | Okutoh et al. | |
| 6,586,790 B2 * | 7/2003 | Kanaya et al. ............ | 257/295 |
| 6,610,549 B1 | 8/2003 | Aggarwal et al. | |
| 6,611,014 B1 | 8/2003 | Kanaya et al. | |
| 6,642,100 B2 | 11/2003 | Yang et al. | |
| 6,682,995 B2 | 1/2004 | Zhang et al. | |

(Continued)

OTHER PUBLICATIONS

"FeRAM Tutorial", Ali Sheikholeslami and P. Glenn Gulak, A survey of circuit Innovations in Ferroelectric random-access memories, Proceedings of the IEEE, vol. 88, No. 3, May, 2000, 3 pages, taken from the Internet at: http://www.eecg.toronto.edu/-ali/ferro/tutorial.html.

(Continued)

*Primary Examiner*—Hung Vu
(74) *Attorney, Agent, or Firm*—Jacqueline J. Garner; W. James Brady, III; Frederick J. Telecky, Jr.

(57) ABSTRACT

Hydrogen barriers and fabrication methods are provided for protecting ferroelectric capacitors ($C_{FE}$) from hydrogen diffusion in semiconductor devices (102), wherein nitrided aluminum oxide (N—$AlO_x$) is formed over a ferroelectric capacitor ($C_{FE}$), and one or more silicon nitride layers (112, 117) are formed over the nitrided aluminum oxide (N—$AlO_x$). Hydrogen barriers are also provided in which an aluminum oxide ($AlO_x$, N—$AlO_x$) is formed over the ferroelectric capacitors ($C_{FE}$), with two or more silicon nitride layers (112, 117) formed over the aluminum oxide ($AlO_x$, N—$AlO_x$), wherein the second silicon nitride layer (112) comprises a low silicon-hydrogen SiN material.

8 Claims, 11 Drawing Sheets

U.S. PATENT DOCUMENTS

| | | |
|---|---|---|
| 6,706,540 B2 | 3/2004 | Hikosaka et al. |
| 6,730,951 B2 * | 5/2004 | Nagano et al. ............ 257/296 |
| 6,781,184 B2 | 8/2004 | Solayappan et al. |
| 2001/0034106 A1 | 10/2001 | Moise et al. |
| 2001/0044205 A1 | 11/2001 | Gilbert et al. |
| 2003/0006439 A1 | 1/2003 | Bailey |
| 2003/0098497 A1 | 5/2003 | Solayappan et al. |
| 2003/0129847 A1 | 7/2003 | Celii et al. |

OTHER PUBLICATIONS

"A survey of Circuit Innovations in Ferroelectric Random Access Memories", Ali Sheikholeslami and P. Glenn Gulak, Proceedings of the IEEE, vol. 88, No. 5, May, 2000, pp. 667-689.

"Generic CVD Reactor", CVD Basics, Daniel M. Dobkin, Dec. 7, 2001, 3 pages, taken from the Internet at: http://www.batnet.com/enigmatics/semiconductor_processing/CVD_Fundamentals/introdu. . .

"Physical Vapor Deposition", Cougar Labs, Inc., Dec. 7, 2001, 9 pages, taken from the Internet at: http://www.cougarlabs.com/pvd1.html.

"Parasitic Channel Induced by Spin-On-Glass in a Double-Level Metallization Complimentary Metal Oxide Semiconductor Process", M. Murata, K. Yomauchi, H. Kojima, A. Yokoyama, T. Inoue and T. Iwamori, published in the Journal of Electrochemical Society, vol. 149, No. 8, 1993, pp. 2346-2356.

"Effects of Oxygen Content on Properties of Silicon Oxide Films Prepared at Room Temperature by Sputtering-Type Electron Cyclotron Resonance Plasma", Katsuhiko Furukawa, Yichun Liu, Hiroshi Nakashima, Dawei Gao, Yasuhiro Kashiwazaki, Kiichiro Uchino, Katsunori Muraoka and Hirohisa Tsuzuki, Journal of Applied Physics, vol. 84, No. 8, Oct. 15, 1998, pp. 4579-4584.

Notes taken at the International Symposium on Applications of Ferroelectrics Conference in Nara, Japan in May, 2002. The speaker was H. Nagel of Infineon Technologies and Toshiba Corporation, Key Technologies for High Density FeRAM Application, one page.

"The Hydrogen Content of Plasma-Deposited silicon Nitride", W. A. Lanford and M. J. Rand, American Institute of Physics, J. Appl. Phys. 49(4), Apr., 1978, pp. 2473-2477.

"Free Energy Model for the Analysis of Bonding in a-$Si_xN_yH_z$ Alloys", Z. Yin and W. Smith, J. Vac. Sci. Technol. A. vol. 9, No. 3, MayJun., 1991, p. 972.

"Comparison Between HCP CVD and PECVD Silicon Nitride for Advanced Interconnect Applications", J. Yota, M. Janani, L.E. Camilletti, A. Kar-Roy, Q.Z. Liu, C. Nguyen, M.D. Woo J. Hander, and P. Van Cleemput, IEEE, 2000, pp. 76-78.

"Hydrogen Role on the Properties of Amorphous Silicon Nitride", F. De Brito Mots, J.F. Justo and A. Fazzio, Journal of Applied Physics, vol. 86, No. 4, Aug. 15, 1999, pp. 1843-1847.

* cited by examiner

FERROELECTRIC CAPACITOR HYDROGEN BARRIERS AND METHODS FOR FABRICATING THE SAME

RELATED APPLICATIONS

This application is related to U.S. patent application Ser. No. 10/620,516, filed on Jul. 16, 2003, entitled "HYDROGEN BARRIER FOR PROTECTING FERROELECTRIC CAPACITORS IN A SEMICONDUCTOR DEVICE AND METHODS FOR FABRICATING THE SAME", and U.S. patent application Ser. No. 10/635,994, filed on Aug. 7, 2003, entitled "LOW SILICON-HYDROGEN SiN LAYER TO INHIBIT HYDROGEN RELATED DEGRADATION IN SEMICONDUCTOR DEVICES HAVING FERROELECTRIC COMPONENTS", the entirety of these being hereby incorporated by reference as if fully set forth herein.

FIELD OF INVENTION

The present invention relates generally to semiconductor devices and more particularly to hydrogen barriers for protecting ferroelectric capacitors in a semiconductor device.

BACKGROUND OF THE INVENTION

Memory is used for storage of data, program code, and/or other information in many electronic products, such as personal computer systems, embedded processor-based systems, video image processing circuits, portable phones, and the like. Memory cells may be provided in the form of a dedicated memory integrated circuit (IC) or may be embedded (included) within a processor or other IC as on-chip memory. Ferroelectric memory, sometimes referred to as "FRAM" or "FERAM", is a non-volatile form of memory commonly organized in single-transistor, single-capacitor (1T/1C) or two-transistor, two-capacitor (2T/2C) configurations, in which each memory cell includes one or more access transistors. The non-volatility of an FERAM is due to the bi-stable characteristic of the ferroelectric material in the cell capacitor(s). The cells are typically organized in an array, such as folded-bitline, open-bitline architectures, etc., wherein the individual cells are selected by plateline and wordline signals from address decoder circuitry, with the data being read from or written to the cells along bitlines using sense amp circuits.

FIG. 1 illustrates a 1T/1C FERAM cell 10 including a transistor 12 and a ferroelectric cell capacitor 14. A bottom electrode of the cell capacitor 14 is connected to a first source/drain terminal 15 of the transistor 12 and the other capacitor electrode is coupled to a plateline or driveline 20. Data is read from the cell 10 by applying a signal to the gate 16 of the transistor 12 along a corresponding wordline WL, thereby connecting the bottom electrode of the ferroelectric capacitor 14 to the other transistor source/drain at a bitline 18. A pulse signal is applied to the plateline 20, where the potential on the bitline 18 is the capacitor charge divided by the bitline capacitance. The capacitor charge is dependent upon the pre-existing bi-stable polarization state of the ferroelectric material in the capacitor 14, wherein the bitline potential can have two distinct values. A sense amplifier (not shown) is connected to the bitline 18 to detect the voltage associated with a logic value of either 1 or 0. Because such a read operation is destructive, the cell data is then rewritten back to the memory cell 10.

FIG. 2 illustrates a 2T/2C memory cell 30 in a memory array coupled to a complementary pair of bitlines 32 and 34, where the cell 30 comprises cell transistors 36 and 38 and ferroelectric cell capacitors 40 and 42. The first transistor 36 couples the bitline 32 with a first ferroelectric capacitor 40, and the second transistor 38 couples the complementary bitline 34 to a second ferroelectric capacitor 42. The first and second capacitors 40 and 42 have a common plateline 44 to which a signal is applied for polarizing the capacitors 40 and 42 during read and write operations. For a write operation, the transistors 36 and 38 are enabled via a wordline 46 to couple the capacitors 40 and 42 to the complementary logic levels on the bitlines 32 and 34 corresponding to a logic state to be stored in the cell 30. The plateline 44 is pulsed to polarize the capacitors 40, 42 to correspond to the desired logic state. In a read operation, the transistors 36 and 38 are enabled via the wordline 46 to couple the information stored in the ferroelectric capacitors 40 and 42 to the complementary bitline pair 32 and 34, and a pulse is applied to the plateline 44. This provides a differential signal across the bitline pair 32 and 34 that is sensed by a sense amplifier (not shown), wherein the sensed signal has a polarity corresponding to the data read from the cell 30.

Ferroelectric memory cells are often fabricated in stand-alone memory integrated circuits (ICs) and/or in logic circuits having on-board non-volatile memory (e.g., microprocessors, microcontrollers, DSPs, communications chips, etc.). The ferroelectric memory arrays are typically constructed in a device wafer along with CMOS logic circuits, wherein the cell transistors are often formed concurrently with logic transistors in the device, and the ferroelectric capacitors are constructed in a capacitor layer above the wafer substrate. For example, the construction of the ferroelectric cell capacitors may be integrated into a CMOS fabrication process flow after transistor formation (e.g., after 'front-end' processing), and before the metalization or interconnection processing (e.g., before 'back-end' processing). However, many back-end processing steps include hydrogen, for example, in forming trench etch-stop layers, etch clean operations, copper sintering, and other process steps during metalization. This process hydrogen diffuses into the ferroelectric cell capacitors, causing degradation in the electric properties of the ferroelectric memory cells, including degraded switched polarization. In addition, hydrogen can degrade the performance of transistors in the semiconductor device, for example, causing fixed oxide charge and interface traps at the interface between the transistor gate dielectric and the underlying silicon, leading to negative bias temperature instability (NBTI). This results in reduced drain saturation current (Idsat) and an increase in the transistor threshold voltage (Vsat). Consequently, there is a need for hydrogen barriers and fabrication techniques for protecting ferroelectric capacitors and transistors against hydrogen in back-end and other fabrication processing.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope of the invention. The summary is provided, rather, to present one or more concepts of the invention in a simplified form as a prelude to the more detailed description that is presented later.

The present invention relates to hydrogen diffusion barriers for protecting ferroelectric capacitors against hydrogen diffusion in semiconductor devices. One such barrier comprises nitrided aluminum oxide as well as one or more overlying silicon nitride layers. Another hydrogen barrier comprises aluminum oxide formed over the ferroelectric capacitor, with two or more silicon nitride layers formed over the aluminum oxide, wherein the second silicon nitride layer comprises a low silicon-hydrogen SiN material. These new hydrogen barrier structures have been found to facilitate improved ferroelectric capacitor performance with respect to switched polarization compared with conventional techniques in which a single aluminum oxide layer was used.

In accordance with one aspect of the invention, methods are provided for fabricating semiconductor devices and hydrogen barriers thereof, in which a multilayer hydrogen barrier is formed along at least a portion of a side of a ferroelectric capacitor, where the multilayer hydrogen barrier comprises nitrided aluminum oxide and silicon nitride. The nitrided aluminum oxide may be formed by any suitable process, and may be wholly or partially nitrided after formation of aluminum oxide, or may be initially formed as nitrided aluminum oxide. Nitridation of deposited aluminum oxide may be accomplished by plasma nitridation, thermal nitridation, or other nitridation processing, wherein nitridation of deposited aluminum oxide may, but need not, be performed in-situ with formation of silicon nitride material over the nitrided aluminum oxide. The silicon nitride can be any suitable single or multi-layer silicon and nitrogen containing material or materials, formed over at least a portion of the aluminum oxide using any suitable deposition process or processes. In one implementation, a high density plasma deposition process is employed to form a first silicon nitride layer over at least a portion of the aluminum oxide material, and a PECVD or other deposition process is performed to deposit a silicon nitride layer over at least a portion of the first silicon nitride layer, where the second silicon nitride layer comprises a low silicon-hydrogen SiN material.

In accordance with another aspect of the invention, a method is provided for fabricating semiconductor devices and hydrogen barriers therefor, in which an aluminum oxide material is formed along at least a portion of a side of a ferroelectric capacitor, and a first silicon nitride layer is formed over at least a portion of the aluminum oxide material. The method further comprises forming a second silicon nitride layer over at least a portion of the first silicon nitride layer, in which the second silicon nitride layer comprises a low silicon-hydrogen SiN material.

According to yet another aspect of the invention, semiconductor devices and hydrogen barriers thereof are provided, wherein the hydrogen barrier comprises a nitrided aluminum oxide material formed along at least a portion of a side of the ferroelectric capacitor, as well as a silicon nitride layer formed over the nitrided aluminum oxide. The silicon nitride can be a single or multi-layer structure, and may comprise a low silicon-hydrogen SiN material. In one example, first and second silicon nitride layers are provided over the nitrided aluminum oxide, wherein the second silicon nitride includes low silicon-hydrogen SiN material.

In accordance with still another aspect of the invention, semiconductor devices and hydrogen barriers thereof are provided, wherein the hydrogen barrier comprises an aluminum oxide material formed along at least a portion of a side of a ferroelectric capacitor, a first silicon nitride layer formed over at least a portion of the aluminum oxide material, and a second silicon nitride layer formed over at least a portion of the first silicon nitride layer, the second silicon nitride layer comprising a low silicon-hydrogen SiN material.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
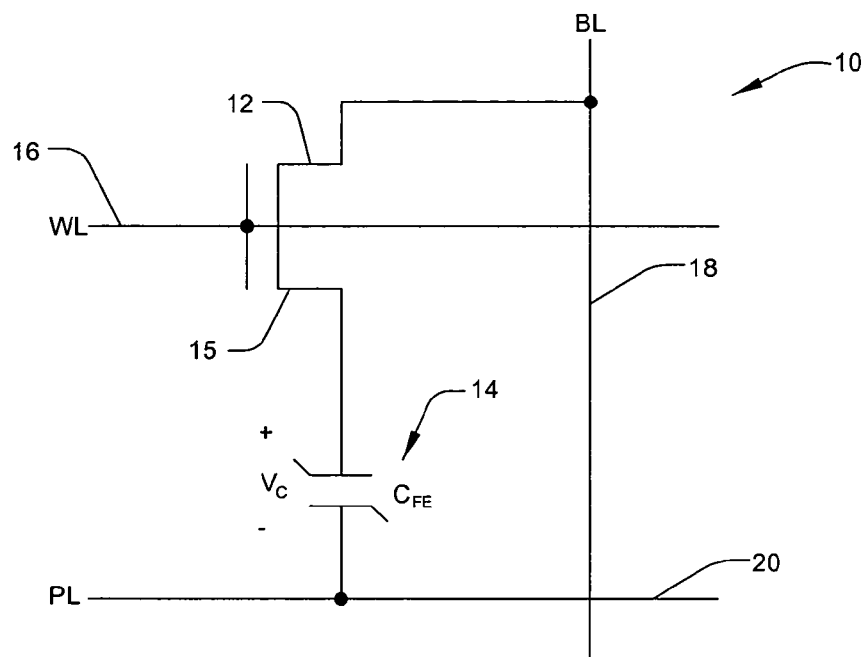
FIGS. 1 and 2 are schematic diagrams illustrating exemplary 1T/1C and 2T/2C FERAM memory cells, respectively.
Figure 2:
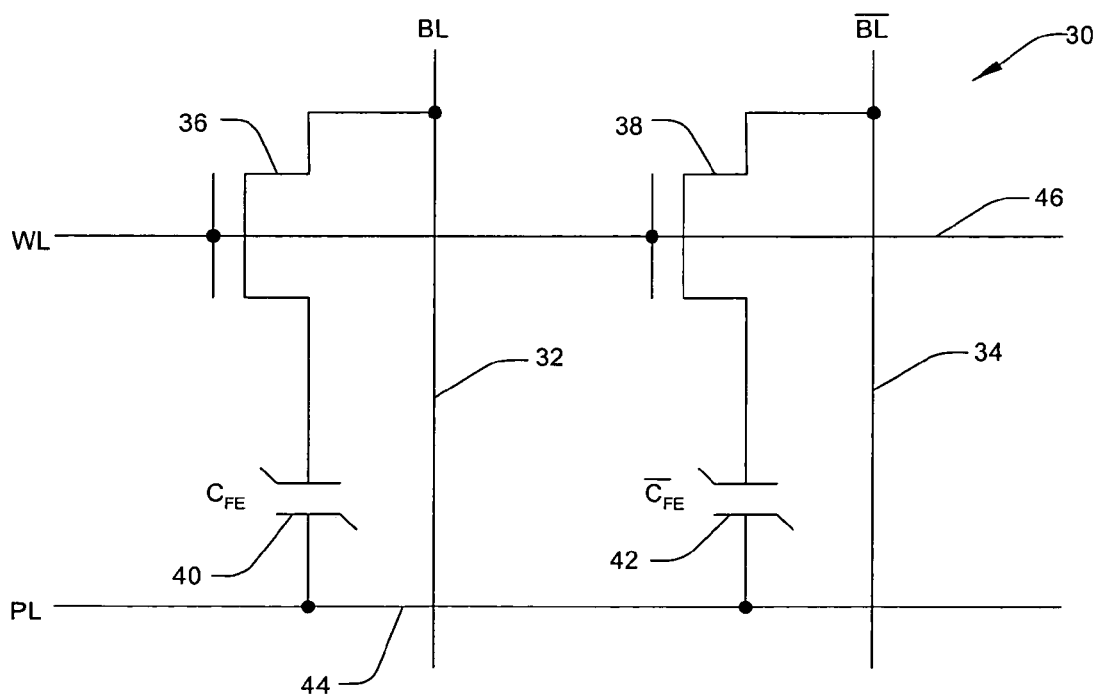

The present invention will now be described with reference to the attached drawing figures, wherein like reference numerals are used to refer to like elements throughout, and wherein the illustrated structures are not necessarily drawn to scale. The invention provides semiconductor devices with improved hydrogen diffusion barriers and fabrication methods thereof, in which nitrided aluminum oxide materials and multi-layer silicon nitride structures are employed separately or in combination to protect ferroelectric capacitors and underlying transistors against back-end process hydrogen diffusion. The inventors have appreciated that operational properties of ferroelectric materials and/or transistor devices may be severely degraded by exposure to hydrogen during processing of semiconductor devices, including back-end processing found in many CMOS integration schemes. The inventors have found that nitrided aluminum oxide and low silicon-hydrogen SiN films operate as a barrier to hydrogen diffusion, and therefore may be employed to protect ferroelectric capacitors and/or MOS transistors from hydrogenating processes during semiconductor device fabrication.

Referring now to FIGS. 3, 4A–4C, and 5A–5Q, several exemplary implementations of the invention are hereinafter illustrated. FIGS. 3, 4A and 5I–5J depict a method 50 for fabricating a semiconductor device and an exemplary device 102 undergoing fabrication processing according to the method 50, with ferroelectric capacitors and a multi-layer hydrogen barrier comprising nitrided aluminum oxide and a low Si—H silicon nitride. FIGS. 4B, 4C, and 5K–5Q depict techniques for forming various alternative hydrogen barriers in the method 50 within the scope of the invention, as illustrated and described further below. While the method 50 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices illustrated and described herein, such as the exemplary device 102 in FIGS. 5A–5Q, as well as in association with other semiconductor devices and hydrogen barrier structures not illustrated.

The invention may be employed in association with semiconductor devices having ferroelectric capacitors fabricated with any ferroelectric materials, including but not limited to PZT. In addition, the invention may be employed in conjunction with ferroelectric memories using any cell types and array architectures including but not limited to 1T-1C, 2T-2C, or other cell types organized in folded-bitline, open-bitline, chain-FRAM, or other array configurations. In addition, while one or more exemplary semiconductor devices are illustrated and described herein with ferroelectric capacitors formed in a dielectric layer or level (e.g., capacitor level) after front-end contact formation and prior to formation of overlying metalization levels, the invention may be employed in devices where ferroelectric capacitors are formed at any level in a multi-level semiconductor device design. Furthermore, the invention may be employed in semiconductor devices fabricated on or in any type of semiconductor body, including but not limited to silicon substrates and SOI wafers. In this regard, the invention is not limited to the examples illustrated and described herein, and all variant implementations providing multi-layer hydrogen barriers with nitrided aluminum oxide and/or low Si—H silicon nitride materials are contemplated as falling within the scope of the present invention and the appended claims.

Figure 3:
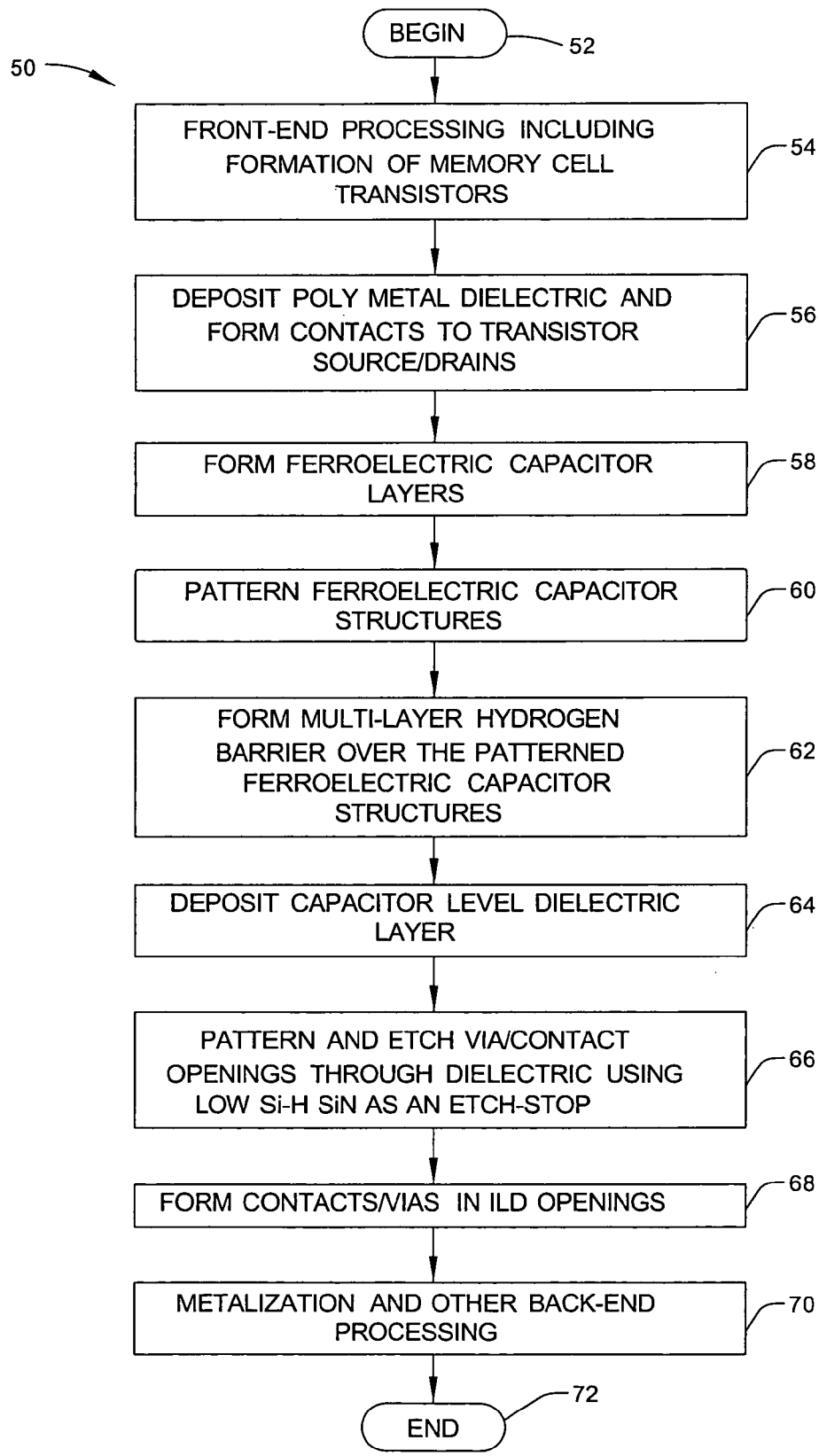
FIG. 3 is a flow diagram illustrating an exemplary method of fabricating a semiconductor device with a hydrogen diffusion barrier in accordance with one or more aspects of the present invention.
Figure 4A:
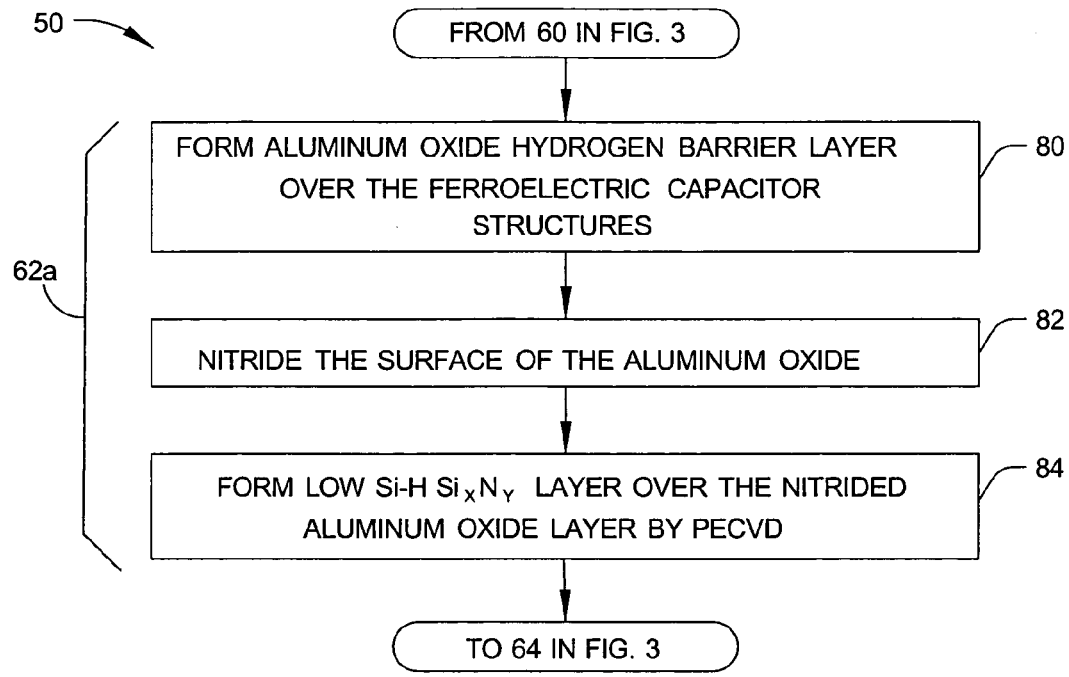
FIG. 4A is a partial flow diagram illustrating fabrication of one exemplary hydrogen barrier in the method of FIG. 3.
Figure 5A:
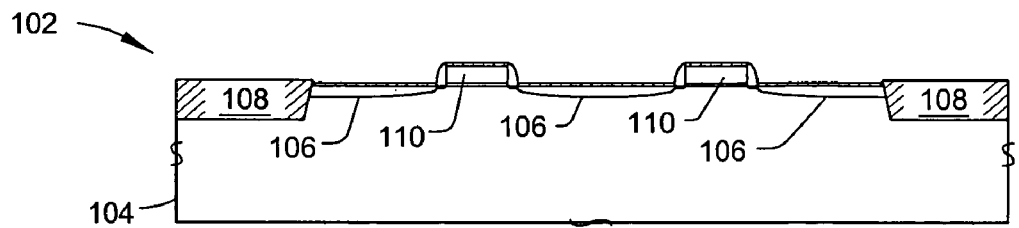
FIGS. 5A–5J are partial side elevation views in section illustrating an exemplary semiconductor device having a multilayer hydrogen barrier with nitrided aluminum oxide and low Si—H silicon nitride layers in accordance with the invention undergoing fabrication processing generally according to the method of FIGS. 3 and 4A.

Referring initially to FIGS. 3, 4A, and 5A–5J, the method 50 begins at 52 in FIG. 3, wherein front-end processing is performed at 54, including formation of transistors for the ferroelectric memory cells and transistors and other electronic components for other circuits within the device, using any suitable materials and processing steps. FIG. 5A illustrates an exemplary semiconductor device 102 following such front-end processing in which cell transistors have been formed on or in a semiconductor body 104 prior to fabrication of a poly metal dielectric (PMD) level. The device 102 includes a semiconductor body 104 (e.g., silicon substrate, SOI wafer, etc.) in which transistor source/drains 106 are formed in active regions separated by STI or LOCOS isolation structures 108, and wherein gate structures 110 are formed over channel regions of the substrate 104 as part of conductive polysilicon wordline structures for a ferroelectric memory array. MOS type cell transistors are thus formed by the gates 110 and the source/drains 106, wherein the source/drains 106 are formed by doping portions of active regions in the substrate, and wherein the source/drain 106 coupled with a memory array bitline (e.g., the middle source/drain 106 in FIGS. 5A–5J) is shared between adjacent transistors in the illustrated example.

Figure 5B:
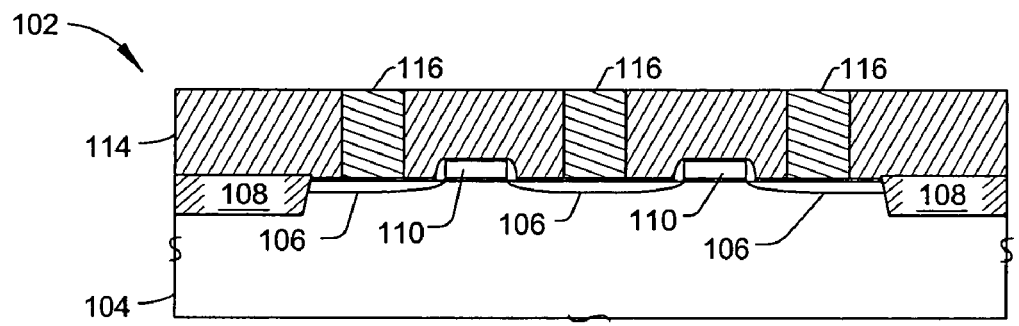

At 56, an initial inter-level or inter-layer dielectric (ILD) 114 is formed over the cell transistors using any suitable dielectric material and deposition process, where the initial ILD is referred to herein as a poly metal dielectric (PMD). Conductive contacts 116 are formed through the PMD at 56 to provide electric connection to the transistor bitline source/drains (e.g., source/drain 12 in FIG. 1 above), as well as to the source/drains for connection with subsequently formed ferroelectric capacitors (e.g., source/drain 15 in FIG. 1). Any suitable etching and contact formation steps and materials may be employed at 56 within the scope of the invention. As illustrated in FIG. 5B, a poly metal dielectric (PMD) layer 114 is formed over the transistors and the substrate 104, through which conductive contacts 116 are formed for interconnection of the source/drain terminals 106, where the contacts 116 may be formed of any conductive material or materials, such as tungsten or the like.

Figure 5C:
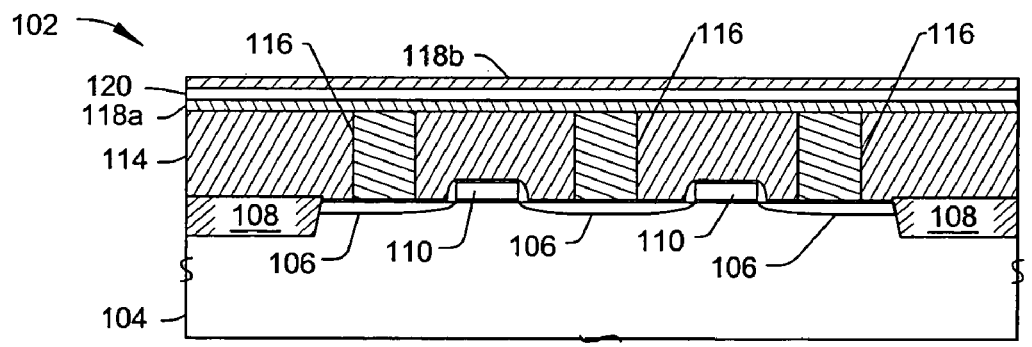
Figure 5D:
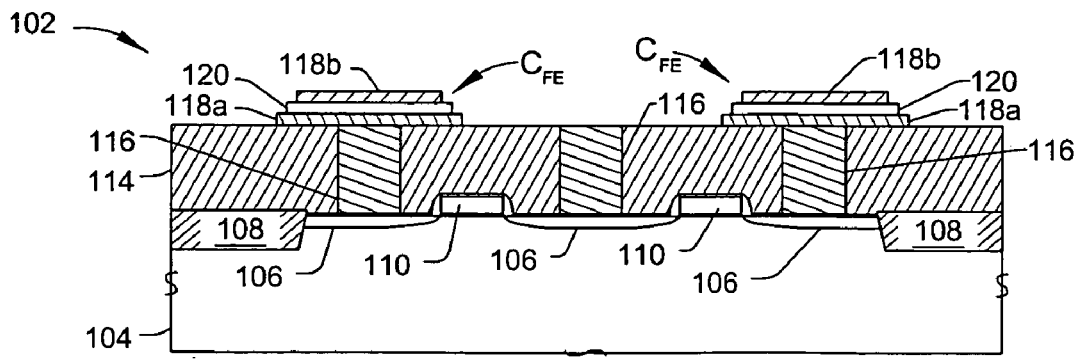
Figure 5E:
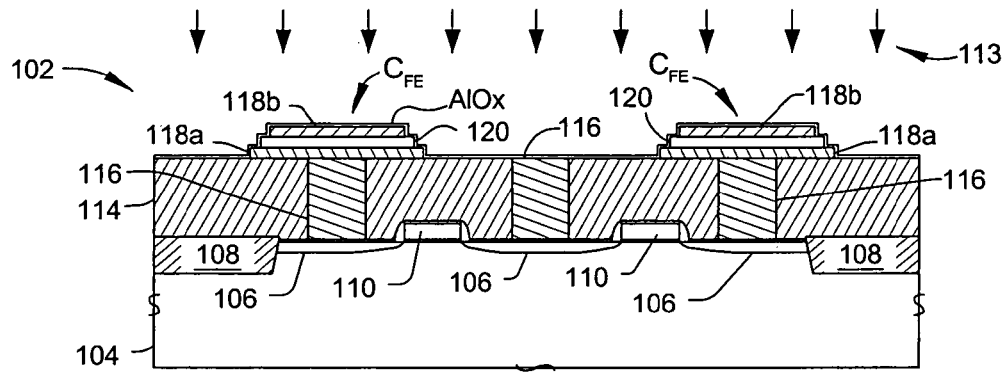

Ferroelectric capacitors are then formed over the PMD at 58 and 60 (FIGS. 5C and 5D). Ferroelectric capacitor layers are formed at 58 over the PMD dielectric and the contacts, including formation of upper and lower conductive capacitor electrode or plate layers and a ferroelectric material layer between the electrode layers, using any suitable conductive and ferroelectric materials and deposition processes. In FIG. 5C, capacitor layers are deposited, including upper and lower conductive electrode or plate layers 118$b$ and 118$a$, respectively, with a ferroelectric material layer 120 formed between the electrode layers 118. The capacitor electrodes 118 may be formed of any suitable material or combination of multiple layers of materials. In one example, a diffusion barrier is first created comprising TiN formed over the PMD dielectric 114 and the tungsten contacts 116 via chemical vapor deposition (CVD) with a TiAlN film or a TiAlON being deposited thereover using a physical vapor deposition (PVD) or other process. The bottom electrode material 118$a$ is then formed over the diffusion barrier, for example, comprising any conductive material such as Pt, Pd, PdOx, IrPt alloys, Au, Ru, $RuO_x$, $(Ba,Sr,Pb)RuO_3$, $(Sr,Ba,Pb)IrO_3$, Rh, $RhO_x$, $LaSrCoO_3$, $(Ba,Sr)RuO_3$, $LaNiO_3$, etc., or any stack or combination thereof.

Ferroelectric material 120 is then deposited over the lower electrode material 118$a$ using any appropriate deposition techniques such as metal organic chemical vapor deposition (MOCVD) using any suitable ferroelectric materials, including but not limited to $Pb(Zr,Ti)O_3$ PZT (lead zirconate titanate), doped PZT with donors (Nb, La, Ta) acceptors (Mn, Co, Fe, Ni, Al) and/or both, PZT doped and alloyed with $SrTiO_3$, $BaTiO_3$ or $CaTiO_3$, strontium bismuth tantalate (SBT) and other layered perovskites such as strontium bismuth niobate tantalate (SBNT) or bismuth titanate, $BaTiO_3$, $PbTiO_3$, $Bi_2TiO_3$, etc. The top electrode material 118*b* may be a single layer or a multi-layer conductive structure such as $IrO_x$, $RuO_x$, $RhO_x$, $PdO_x$, $PtO_x$, $AgO_x$, $(Ba,Sr)RuO_3$, $LaSrCoO_3$, $LaNiO_3$, $YBa_2Cu_3O_{7-x}$ with a noble metal layer thereover, wherein the layers 118 and 120 may be formed to any desired thickness in accordance with the invention.

The capacitor layers are then patterned at 60, for example, using suitable masking and etching steps to define ferroelectric capacitor structures having first and second conductive electrodes and a ferroelectric material disposed between the electrodes. The ferroelectric capacitor material layers 118 and 120 are patterned in FIG. 5D using masking and etch processes (not shown) to define the ferroelectric capacitor structures $C_{FE}$ having any desired size (area) and shape. In the exemplary array configuration of the device 102, the first contacts 116 couple the lower capacitor electrodes 118*a* with a first source/drain 106 of the cell transistors, and the shared source/drain is coupled with another contact 116 for connection with a subsequently formed bitline structure for reading and writing data.

A multi-layer hydrogen barrier is then formed at 62 above the ferroelectric capacitors to prevent or inhibit hydrogen diffusion into the ferroelectric material 120 and/or the underlying transistors in subsequent (e.g., back-end) processing of the device 102. In accordance with one aspect of the invention, the hydrogen barrier is formed with a nitrided aluminum oxide layer, as well as one or more overlying silicon nitride layers. FIG. 4A illustrates a method 62*a* for fabricating an exemplary hydrogen barrier at 62 in FIG. 3, and FIGS. 5E–5I illustrate the exemplary device 102 undergoing processing to form the multi-layer hydrogen barrier generally according to the method 62*a* of FIG. 4A.

At 80 in FIG. 4A, a first hydrogen barrier layer is formed over the patterned ferroelectric capacitor structures by depositing aluminum oxide (AlOx in FIGS. 5E and 5G) over the ferroelectric capacitors using a deposition process 113, including formation of aluminum oxide along at least a portion of the sides of the ferroelectric capacitors $C_{FE}$. In one example, the process 113 is a physical vapor deposition (PVD) process that forms an aluminum oxide layer AlOx having a thickness of about 400 Å. In another implementation, an atomic layer deposition (ALD) process 113 is used to deposit the AlOx layer to a thickness of about 100–200 Å. Other aluminum oxide materials having aluminum and oxygen contents and other deposition processes are possible within the scope of the invention, where aluminum oxide material AlOx is formed along at least a portion of one or more sides of the ferroelectric capacitors $C_{FE}$.

Figure 5F:
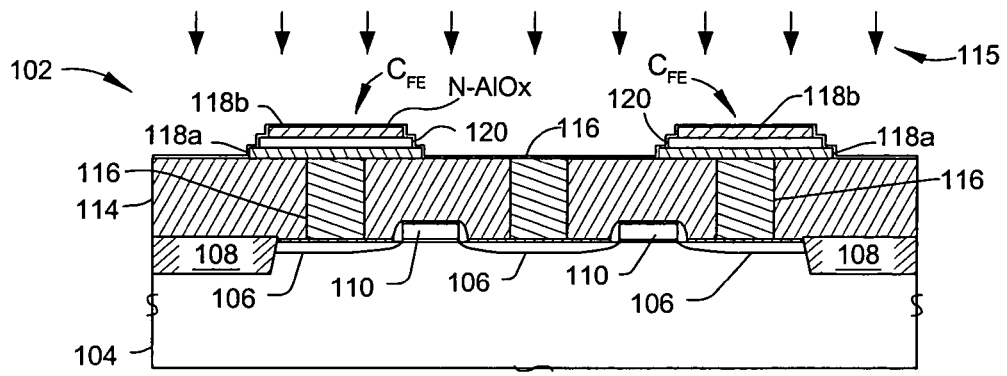
Figure 5G:
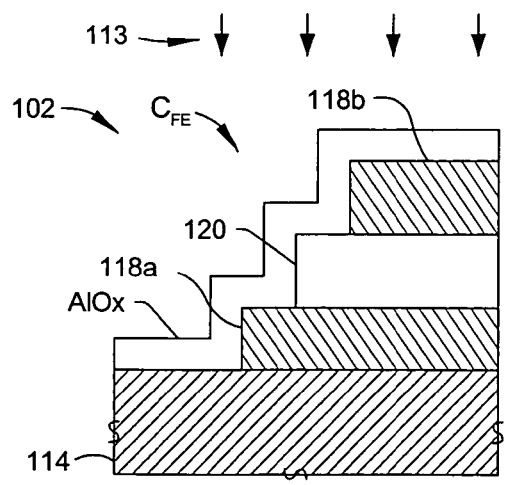
Figure 5H:
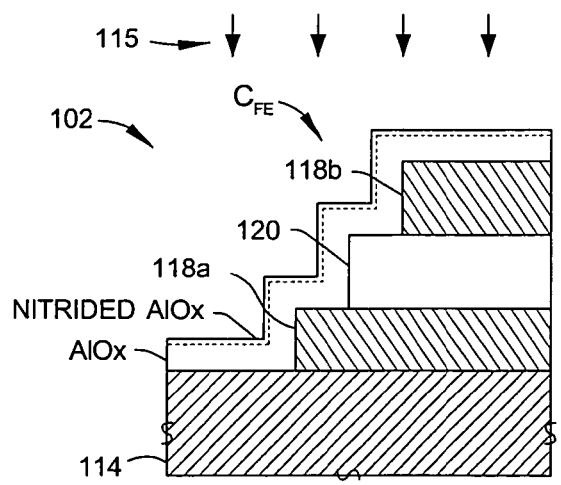

At 82 in FIG. 4A, the deposited aluminum oxide AlOx is nitrided. FIGS. 5F and 5H illustrate performance of an exemplary nitridation process 115 that introduces nitrogen into all or a portion of the deposited aluminum oxide AlOx, thereby forming a nitrided aluminum oxide (N—AlOx in FIG. 5F). A nitrided aluminum oxide material within the scope of the invention includes aluminum oxide in which at least a portion of the aluminum oxide material has a non-zero nitrogen content, wherein all stoichiometric variations of such materials are contemplated as falling within the scope of the invention and the appended claims. In one possible structure, a portion of the nitrided aluminum oxide is substantially nitrogen free and an upper or outer portion thereof includes nitrogen, such as aluminum oxynitride, as illustrated in FIG. 5H. Other implementations are possible in which nitrogen is provided substantially throughout the AlOx material layer, and may even be introduced into portions of the ferroelectric capacitor layers 118 and/or 120, wherein all such variant implementations are contemplated as falling within the scope of the invention.

Any suitable nitridation process 115 can be performed at 82 in accordance with the present invention, including but not limited to plasma nitridation and/or nitrogen bake processes 115. In one implementation, a plasma nitridation process 115 is performed that exposes at least a portion of the aluminum oxide material AlOx to a nitrogen-containing plasma, at a temperature of about 375 degrees C. for about 4 minutes at 1500–3000 Watts RF power. While not wishing to be tied to any particular theory, plasma nitridation processes 115, particularly where relatively higher power is used, are believed to remove or expel some of or more of the moisture from the AlOx than nitrogen bake processes, and/or are believed to form more of an aluminum nitride configuration in at least a portion of the AlOx material, where such implementations have been found to operate as a good barrier against hydrogen diffusion. Any nitrogen-containing plasma may be employed in the plasma nitridation processes 115, including but not limited to nitrogen plasma or nitrous oxide ($N_2O$) based plasmas, which are believed to expel more hydrogen-oxygen (H—O) ions from the AlOx material than nitrogen bake implementations.

Nitrogen bake processes 115 are also possible, wherein the wafer is heated in a nitrogen-containing ambient, for example, at about 400 degrees C. for about 3 minutes in an ambient that contains $N_2$, $N_2O$, or other nitrogen containing environment. In one possible alternative, the nitrogen bake 115 can be performed in-situ with subsequent formation (e.g., deposition) of a silicon nitride layer over the AlOx or N—AlOx layer. Other possible implementations are possible within the scope of the invention, for example, wherein nitrided aluminum oxide material N—AlOx (e.g., wholly or partially nitrided aluminum oxide, such as aluminum oxynitride or other material having non-zero aluminum, oxygen, and nitrogen contents) is formed in a single step, wherein the steps 80 and 82 in FIG. 4A (and in FIG. 4C below) may be a single act. The inventors have found that nitriding all or a portion of the AlOx material improves the device performance with respect to ferroelectric capacitor switched polarization, either with a single SiN layer, or in combination with the multi-layer silicon nitride structures described below.

In addition, the inventors have appreciated that formation of a single or multi-layer silicon nitride (e.g., materials having both silicon and nitrogen contents, such as $Si_3N_4$ or stoichiometric variants thereof, referred to as SiN hereinafter) over the nitrided aluminum oxide advantageously helps to inhibit hydrogen diffusion, leading to improved switched polarization performance in ferroelectric devices. In general, any single or multi-layer silicon nitride material may be formed over the nitrided aluminum oxide using any suitable processes and materials in accordance with the invention. In this regard, although the first barrier layer (e.g., N—AlOx) ideally operates to inhibit the diffusion of hydrogen into the underlying ferroelectric material, the inventors have appreciated that the formation of a low silicon-hydrogen SiN layer 112 over the nitrided AlOx aids in preventing or mitigating hydrogen related performance degradation of the ferroelectric capacitors and the transistors.

Figure 5I:
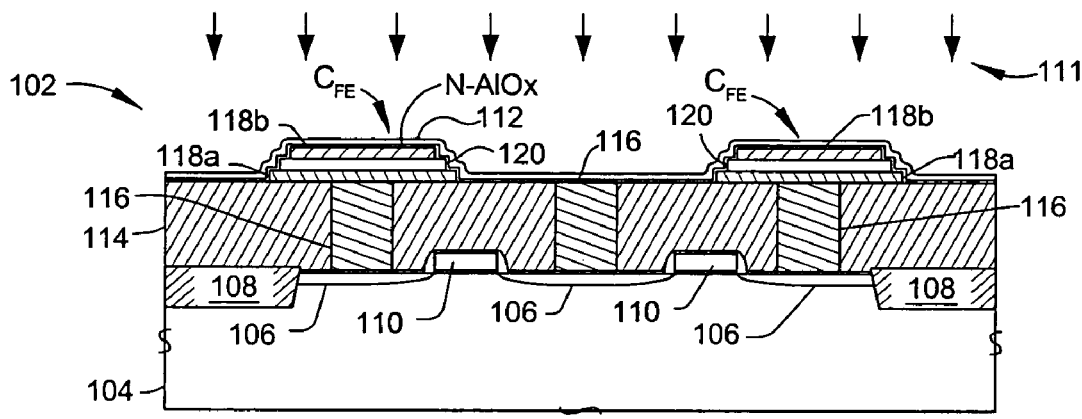

In the example of FIGS. 4A and 5A–5J, a SiN material 112 is formed at 84 over the nitrided AlOx (e.g., layer 112 formed via deposition process 111 in FIG. 5I), having a low Si—H content. In other possible implementations of the present invention, multiple SiN materials are formed over the AlOx, as described in greater detail below. In the example of FIG. 5I, the low silicon-hydrogen SiN layer 112 is deposited to any desired thickness, such as 200–1000 Å, preferably about 500 Å, using any suitable deposition process 111. The process 111 is preferably a plasma enhanced chemical vapor deposition (PECVD) process employing fairly low ammonia flow (NH$_3$) and high N$_2$ flow to provide both a conformal low silicon-hydrogen SiN layer 112, and relatively few, if any, silicon-hydrogen bonds, thereby protecting the ferroelectric transistor C$_{FE}$ from hydrogen associated with subsequent fabrication processing and thermally dissociated hydrogen.

In one example, the PECVD process 111 is performed in FIG. 5I to form a silicon nitride layer 112 over at least a portion of the nitrided aluminum oxide N—AlOx, where the layer 112 comprises a low silicon-hydrogen SiN material having a Fourier Transform Infrared (FTIR) figure of merit value of about 0.05 or less. The FTIR figure of merit is calculated as (Si—H absorbance)/(N—H absorbance×1.4). In other preferred implementations, the low silicon-hydrogen SiN material has an FTIR figure of merit value of about 0.04 or less, about 0.03 or less in another example. In the illustrated device 102, moreover, the low Si—H SiN layer 112 also may operate as an etch-stop material in forming contact openings in a subsequently deposited ILD material.

The inventors have appreciated that conventional silicon nitride materials used as etch stop layers and diffusion barriers typically have a non-zero hydrogen content (e.g., and thus may be more accurately represented as Si$_x$N$_y$H$_z$), where the hydrogen content is contained primarily in Si—H bonds and to a lesser extent N—H bonds. The hydrogen in conventional high silicon-hydrogen SiN films tends to dissociate from the SiN material during thermal processing of a device wafer, where the dissociated hydrogen can further exacerbate degradation of the ferroelectric capacitors and transistors. In this regard, the inventors have further appreciated that the Si—H bonds in a SiN material are of lower bond energy (e.g., about 3.34 eV) than are the N—H bonds (e.g., about 4.05 eV). It is therefore believed that hydrogen in the low Si—H SiN films (e.g., layer 112) of the present invention will have a lower tendency to dissociate than in conventional SiN (e.g., high silicon-hydrogen SiN) films in which the hydrogen content is largely bonded with silicon.

The present invention provides low silicon-hydrogen SiN barriers at one or more locations above the ferroelectric capacitors, alone or in combination with hydrogen barriers between the transistors and the ferroelectric capacitors, wherein the barriers may also, but need not, function as etch stop layers. The employment of one or more low silicon-hydrogen SiN layers facilitates integration of ferroelectric cell capacitor fabrication in conjunction with existing backend interconnect (e.g., metalization) processing, while reducing or mitigating hydrogen-related ferroelectric and transistor degradation in stand-alone memory products or devices having embedded ferroelectric memory. The low silicon-hydrogen SiN materials of the present invention, while having some hydrogen content, are believed to have the hydrogen primarily bonded to nitrogen, with little or no hydrogen bonded to silicon, as expressed by an FTIR figure of merit value of about 0.05 or less, where the FTIR figure of merit is calculated as (Si—H absorbance/(N—H absorbance×1.4)), as illustrated and described further below with respect to FIGS. 6–8B. Any figure of merit may be used in accordance with this aspect of the invention, which quantifies the relative amounts of silicon bonded hydrogen and nitrogen bonded hydrogen.

The low silicon-hydrogen SiN material 112 is preferably formed at 84 using a plasma enhanced chemical vapor deposition (PECVD) process 111 having relatively high nitrogen (N$_2$) gas flow, and relatively low ammonia (NH$_3$) flow, so as to create the material 112 having hydrogen content confined primarily to nitrogen-hydrogen bonds. In one example, the process 111 employs an N$_2$ flow of about 10,000 sccm or more, such as about 14,000 sccm or more, with an NH$_3$ flow of about 1,000 sccm or less, such as about 750 sccm or less. The following table 1 provides process parameters for several exemplary implementations of a PECVD deposition process 111 that may be employed in forming a low silicon-hydrogen layer 112 (e.g., at 84 in FIGS. 4A–4C) within the scope of the invention.

TABLE 1

| Parameter | Recipe I | Recipe II | Recipe III |
| --- | --- | --- | --- |
| N$_2$ flow sccm | 14,000 | 4,500 | 1,500 |
| SiH$_4$ flow sccm | 150 | 50 | 100 |
| NF$_3$ flow sccm | 0 | 0 | 50 |
| NH$_3$ flow sccm | 750 | 250 | 700 |
| HFRF watts | 700 | 1000 | 1000 |
| LFRF watts | 100 | 300 | 300 |
| Pressure Torr | 2.25 | 2.7 | 2.8 |
| Temp deg. C. | 400 | 400 | 400 |
| F.O.M. Si-H/1.4N—H | 0.00 | 0.04 | 0.02 |

The low silicon-hydrogen SiN layer 112 has a low FTIR figure of merit value, for example, about 0.05 or less, calculated as a ratio of the FTIR spectra areas for Si—H and N-H with appropriate scaling (Si—H absorbance/(N—H absorbance×1.4)). The low figure of merit indicates the relatively low amount of Si—H bonds within the SiN material compared to the amount of N—H bonds, wherein the nitrogen bonded hydrogen is less likely to dissociate and cause degradation of the ferroelectric capacitors and or transistors in the semiconductor device. The low silicon-hydrogen SiN layer 112, moreover, may be deposited using a plasma enhanced chemical vapor deposition (PECVD) process employing high nitrogen and low ammonia flows to provide a highly conformal deposition thickness. The conformal deposition thickness facilitates operation of the SiN layer as an effective hydrogen barrier to protect ferroelectric material and transistor gate interfaces, particularly along the sidewalls of a somewhat vertical ferroelectric capacitor stack. The low silicon-hydrogen SiN layer 112 may be formed anywhere above the ferroelectric capacitors, for example, such as directly over the nitrided aluminum oxide or with one or more intervening materials layers therebetween, wherein the low silicon-hydrogen SiN 112 may also operate as an etch stop layer in the capacitor level.

Figure 5J:
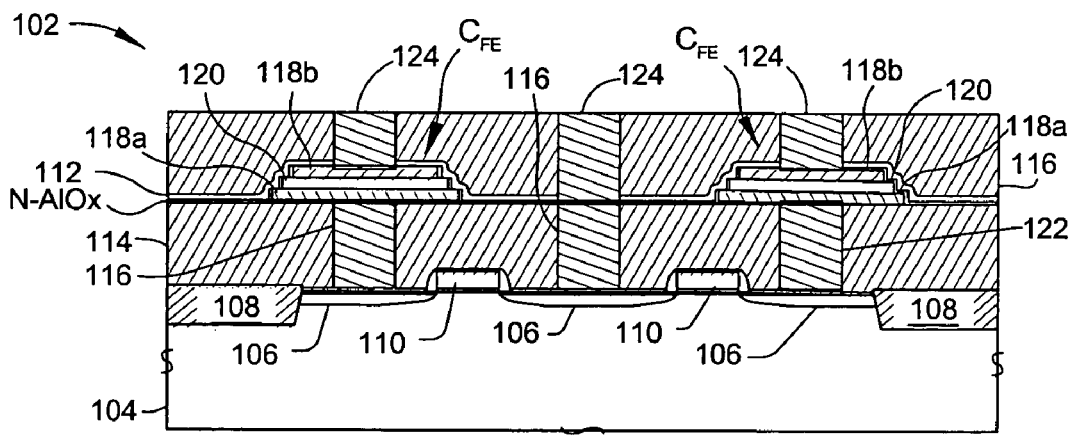
Figure 5K:
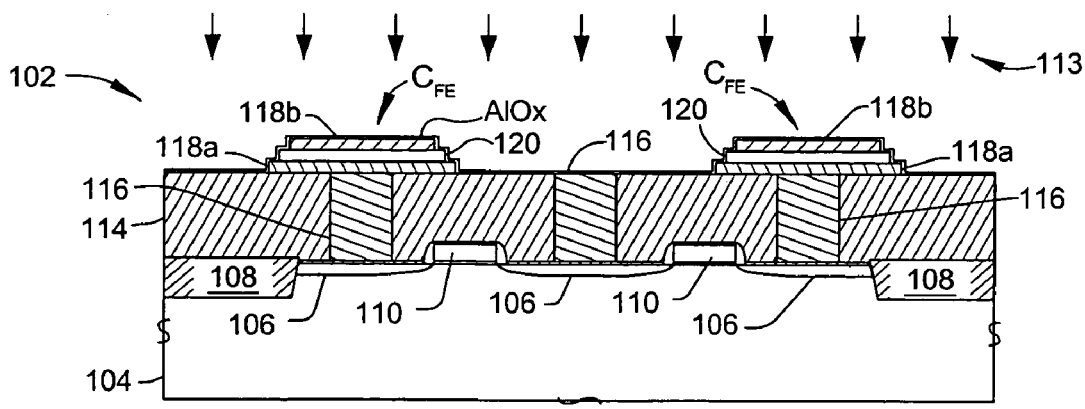
FIGS. 5K–5M are partial side elevation views in section illustrating another exemplary semiconductor device having a multilayer hydrogen barrier with aluminum oxide, a first silicon nitride layer, and a second silicon nitride layer comprising low Si—H silicon nitride material in accordance with the invention undergoing fabrication processing generally according to the method of FIGS. 3 and 4B.

In FIG. 5J, an ILD layer 122 is formed in the capacitor level over the ferroelectric capacitor structures C$_{FE}$, the bitline contacts 116, the PMD dielectric 114, and the low silicon-hydrogen SiN layer 112, where the ILD material 122 may be silicon dioxide (SiO$_2$), FSG, or other suitable dielectric. Openings are etched in the dielectric layer 122 using the low silicon-hydrogen SiN layer 112 as an etch stop layer. The openings through the ILD material 122 are then filled with conductive material (e.g., tungsten, copper, etc.) to form conductive via structures 124 for coupling with the upper capacitor plates 118b and the bitline contacts 116 of the capacitor level. The wafer is thereafter planarized (e.g., using CMP or other techniques), thereby completing the capacitor layer or level in the device 102 as shown in FIG. 5J. Additional ILD dielectric layers (not shown) may thereafter be formed over the ferroelectric capacitor level, and etched to form single and/or dual damascene type openings that are filled with metal (e.g., copper) to complete the metalization in the device 102.

Compared with conventional aluminum oxide/silicon nitride barriers, the inventors have found that full or partial nitridation of the aluminum oxide may facilitate improved switched polarization performance in ferroelectric memory devices. According to another aspect of the invention, multilayer hydrogen diffusion barriers are provided in which an aluminum oxide layer AlOx (that may, but need not be nitrided) is formed at least partially over the ferroelectric capacitors $C_{FE}$, with two or more silicon nitride layers formed over the AlOx.

Referring now to FIGS. 4B and 5K–5M, another aspect of the invention provides for a multilayer hydrogen barrier with aluminum oxide, a first silicon nitride layer, and a second silicon nitride layer that comprises low Si—H silicon nitride material. The provision of the multiple silicon nitride layers, where at least one comprises low Si—H material, may be employed with any aluminum oxide AlOx as set forth in FIGS. 4B and 5K–5M, or in combination with nitrided aluminum oxide N—AlOx, as discussed below with respect to FIGS. 4C and 5N–5Q.

Figure 4B:
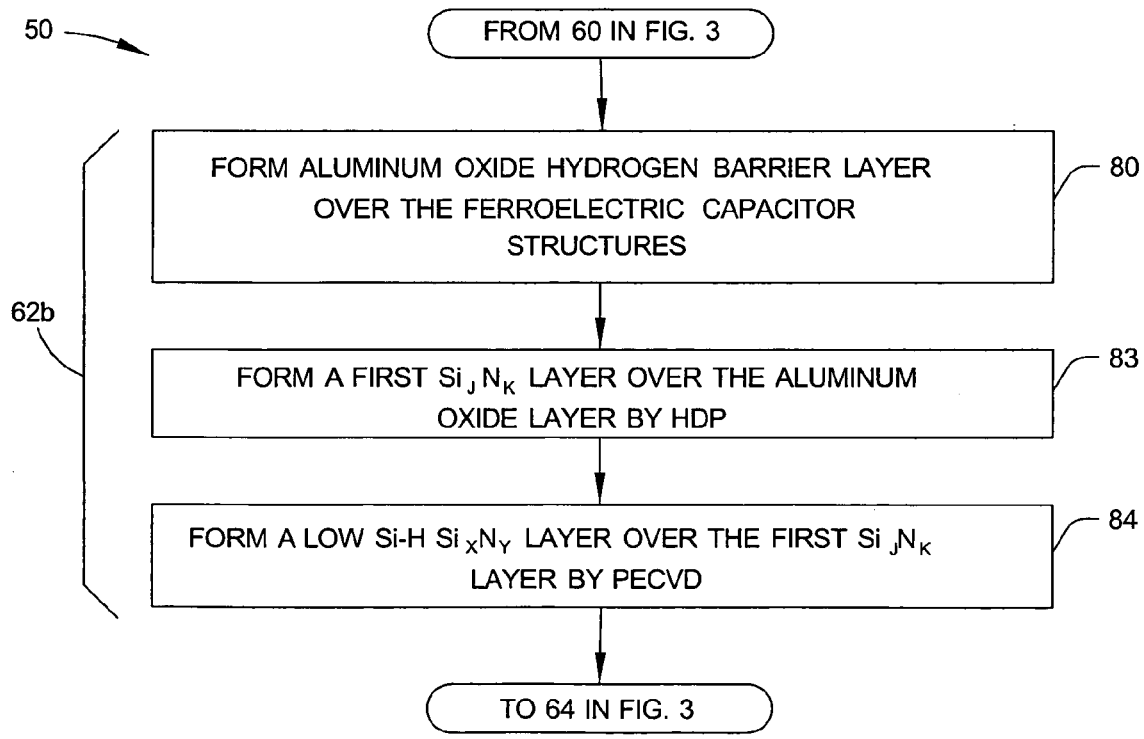
FIG. 4B is a partial flow diagram illustrating fabrication of another exemplary hydrogen barrier in the method of FIG. 3.
Figure 5L:
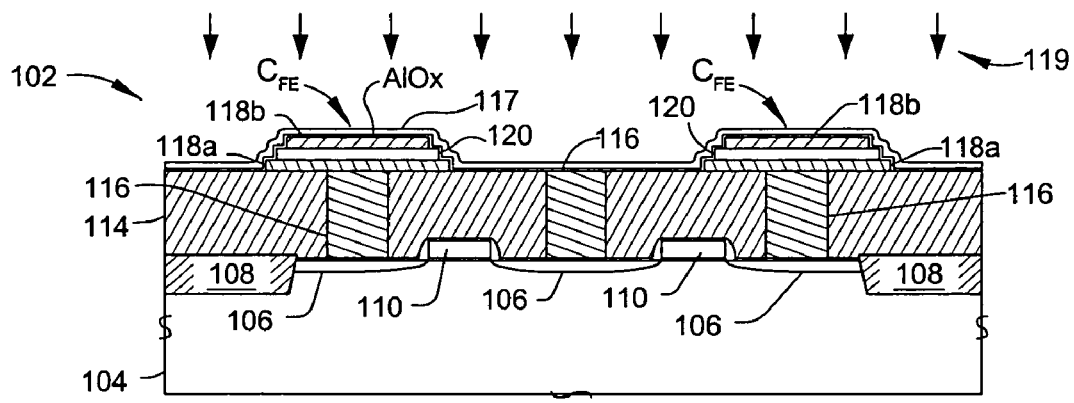

FIG. 4B illustrates acts 62b for forming a multi-layer hydrogen barrier at 62 in the method 50 of FIG. 3, and FIGS. 5K–5M illustrate the exemplary device 102 undergoing hydrogen barrier fabrication processing generally according to the acts of FIG. 4B. At 80 in FIG. 4B, an aluminum oxide layer is formed along at least a portion of the ferroelectric capacitor sides (e.g., AlOx layer formed via the process 113 in FIG. 5K), wherein the same deposition process 113 described above or other suitable material formation processing may be employed. At 83, a first silicon nitride material layer 117 is formed over the aluminum oxide AlOx via a deposition process 119, as shown in FIG. 5L. In one implementation, the formation of the first silicon nitride 117 at 83 involves performing a high density plasma (HDP) deposition process 119, which forms a SiN material 117 that has relatively high amounts of Si—H over the AlOx layer. In the illustrated example, the process 119 employs silane gas flow of about 40 sccm, argon (Ar) flow of about 250 sccm, N2 MFC flow of about 400 sccm, and a low frequency deposition power setting of about 1850 watts, although any suitable deposition process 119 can be used.

Figure 5M:
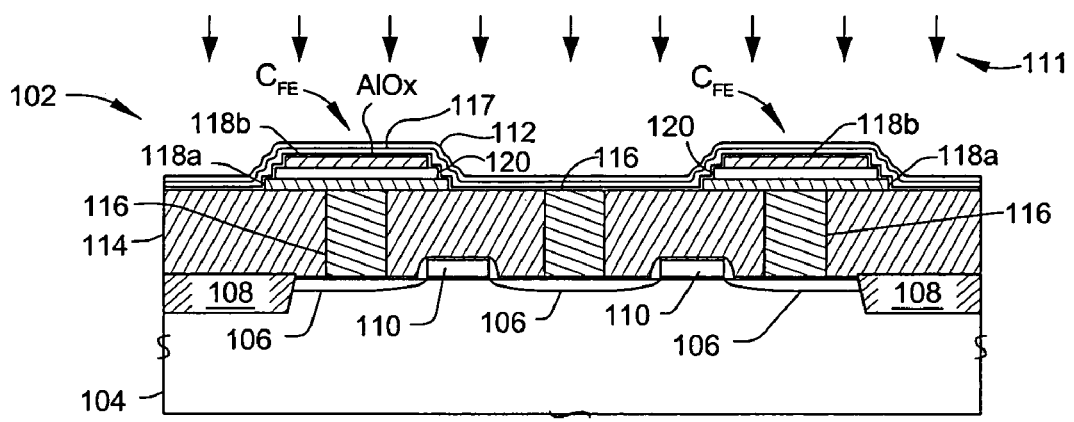

At 84 in FIG. 4B, a second silicon nitride layer 112 is formed over at least a portion of the first silicon nitride layer 117 via the exemplary PECVD process 111 described above or other suitable process, as illustrated in FIG. 5M. The second silicon nitride layer 112 comprises low-silicon-hydrogen SiN material having an FTIR figure of merit value of about 0.05 or less, preferably about 0.04 or less, more preferably about 0.03 or less, wherein the FTIR figure of merit is calculated as (Si—H absorbance)/(N—H absorbance×1.4). The inventors have found that compared with conventional aluminum oxide/silicon nitride barriers, the use of two SiN layers as shown in FIGS. 4B and 5M further improves the switched polarization performance of the underlying ferroelectric capacitors.

Figure 4C:
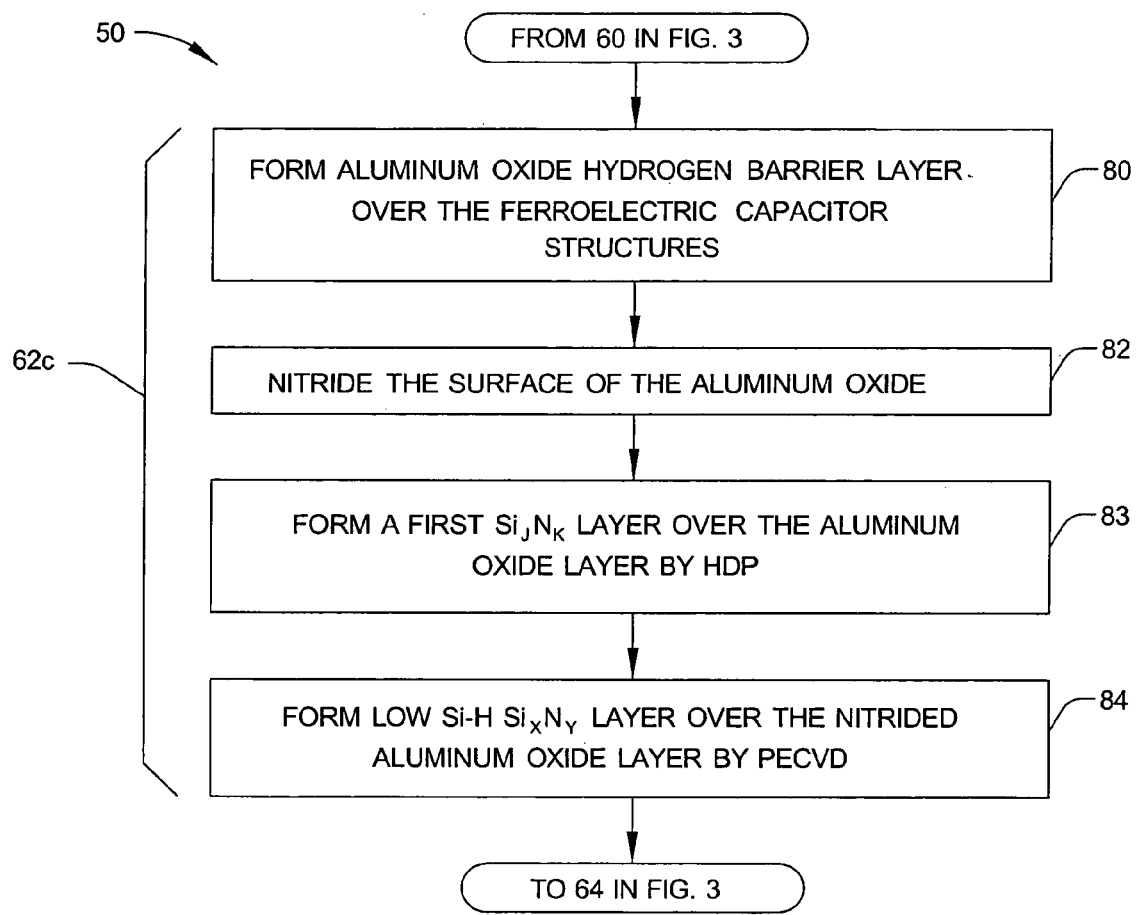
FIG. 4C is a partial flow diagram illustrating fabrication of still another exemplary hydrogen barrier in the method of FIG. 3.
Figure 5N:
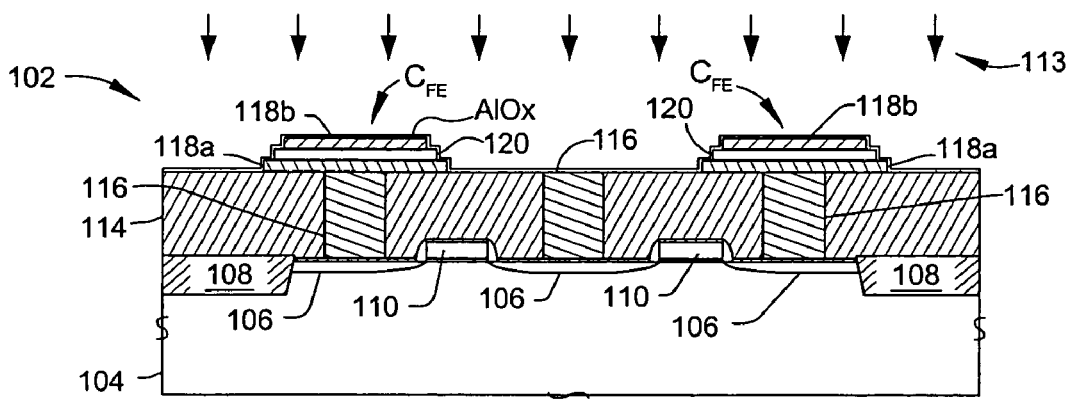
FIGS. 5N–5Q are partial side elevation views in section illustrating another exemplary semiconductor device having a multilayer hydrogen barrier with nitrided aluminum oxide, a first silicon nitride layer, and a second silicon nitride layer comprising low Si—H silicon nitride material in accordance with the invention undergoing fabrication processing generally according to the method of FIGS. 3 and 4C.
Figure 5O:
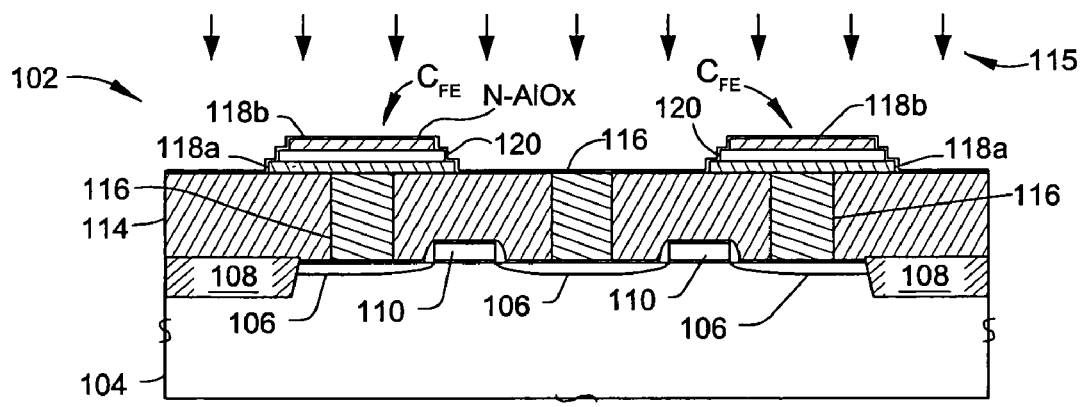

Yet another aspect of the invention provides for combination of nitrided aluminum oxide N—AlOx with a multilayer SiN structure, as shown in FIGS. 4C and 5N–5Q. FIG. 4C illustrates acts 62c for forming a multi-layer hydrogen barrier at 62 in the method 50 of FIG. 3, and FIGS. 5N–5Q illustrate the exemplary device 102 undergoing hydrogen barrier fabrication processing generally according to the acts of FIG. 4C. As illustrated in FIGS. 4C and 5N, an aluminum oxide layer AlOx is formed at 80 along at least a portion of the ferroelectric capacitor sides via the process 113, wherein the same deposition process 113 described above (e.g., with reference to FIGS. 5F and 5H above) or other suitable material formation processing may be employed. In FIG. 5O, the AlOx material is nitrided at 82, using any of the processing described above (e.g., plasma nitridation, nitride bake, or others) to form fully or partially nitrided aluminum oxide N—AlOx over the ferroelectric capacitors $C_{FE}$.

Figure 5P:
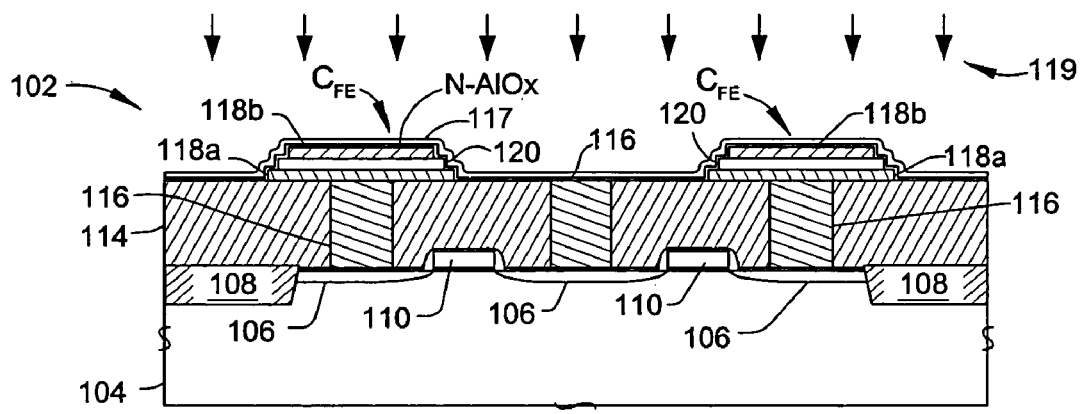
Figure 5Q:
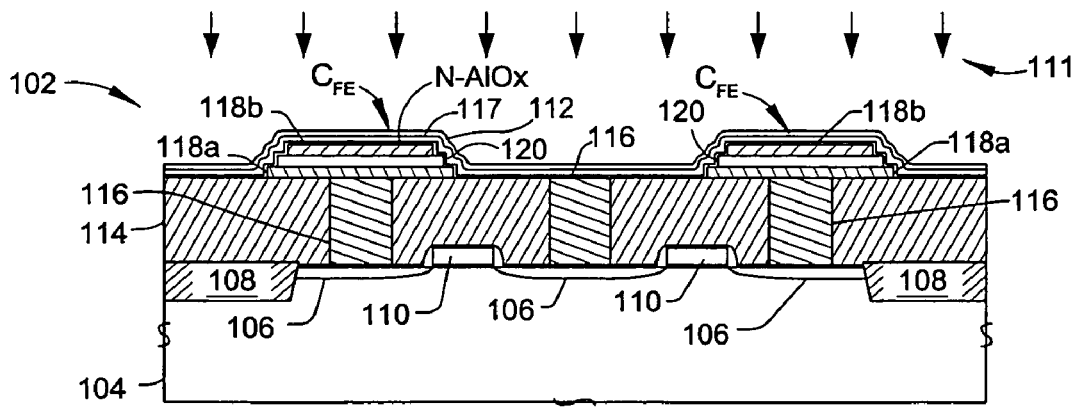

At 83, a first silicon nitride material layer 117 is formed in FIG. 5P over the nitrided aluminum oxide N—AlOx via a deposition process 119 (e.g., HDP process 119 as described above). At 84, a second silicon nitride layer 112 is formed over at least a portion of the first silicon nitride layer 117 via the exemplary PECVD process 111 described above or other suitable process, to provide a low Si—H SiN material 112, as illustrated in FIG. 5Q, wherein the total combined thickness of the SiN layers 117 and 112 can be any value, such as about 500–1000 Å in the illustrated example. As in the above examples, the silicon nitride layer 112 comprises low-silicon-hydrogen SiN material having an FTIR figure of merit value of about 0.05 or less, preferably about 0.04 or less, more preferably about 0.03 or less, wherein the FTIR figure of merit is calculated as (Si—H absorbance)/(N—H absorbance×1.4). The inventors have found that the use of two SiN layers formed over a nitrided aluminum oxide as a hydrogen barrier can significantly improve switched polarization performance, in some examples by as much as 200% or more.

Figure 6:
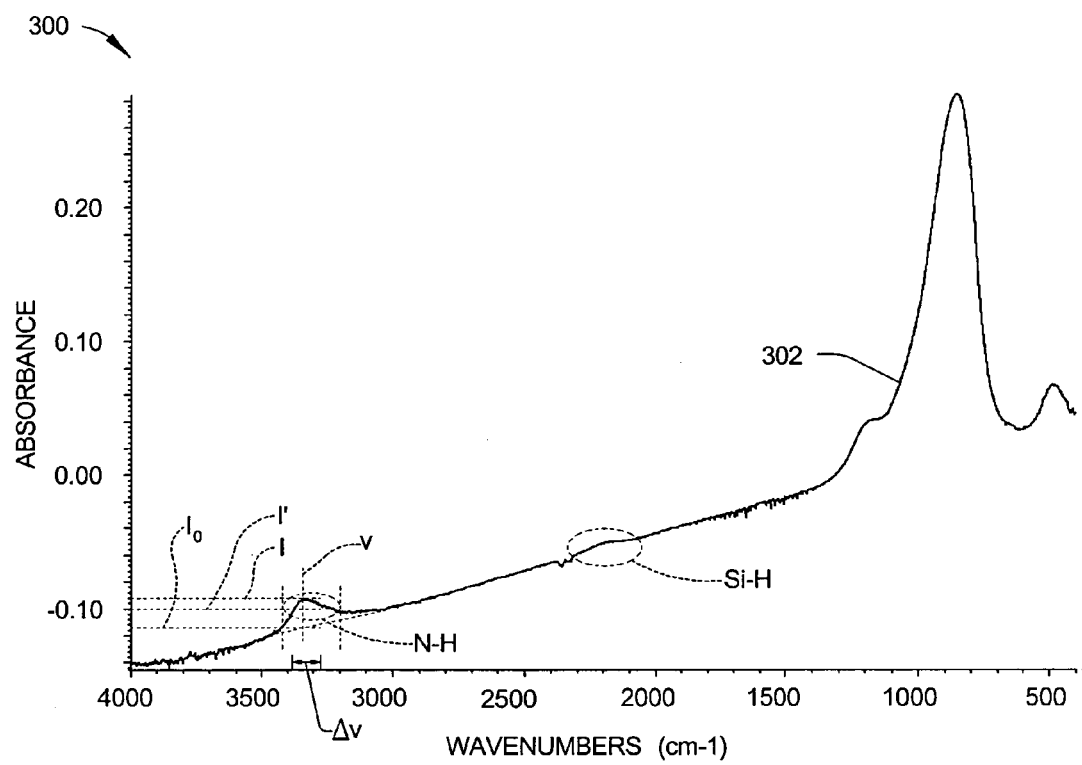
FIG. 6 is an exemplary Fourier Transform Infrared (FTIR) spectra plot illustrating infrared absorbance or absorption for a low silicon-hydrogen SiN material layer in accordance with the invention.
Figure 7:
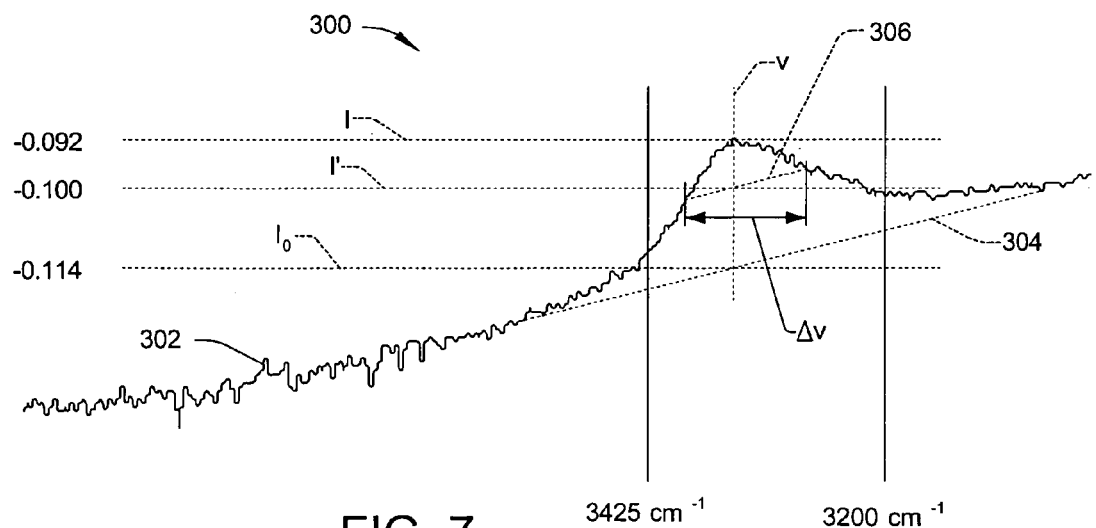
FIG. 7 is a portion of the exemplary FTIR plot of FIG. 6, illustrating one possible technique for determining a figure of merit for a low silicon-hydrogen SiN material layer in accordance with the invention.
Figure 8A:
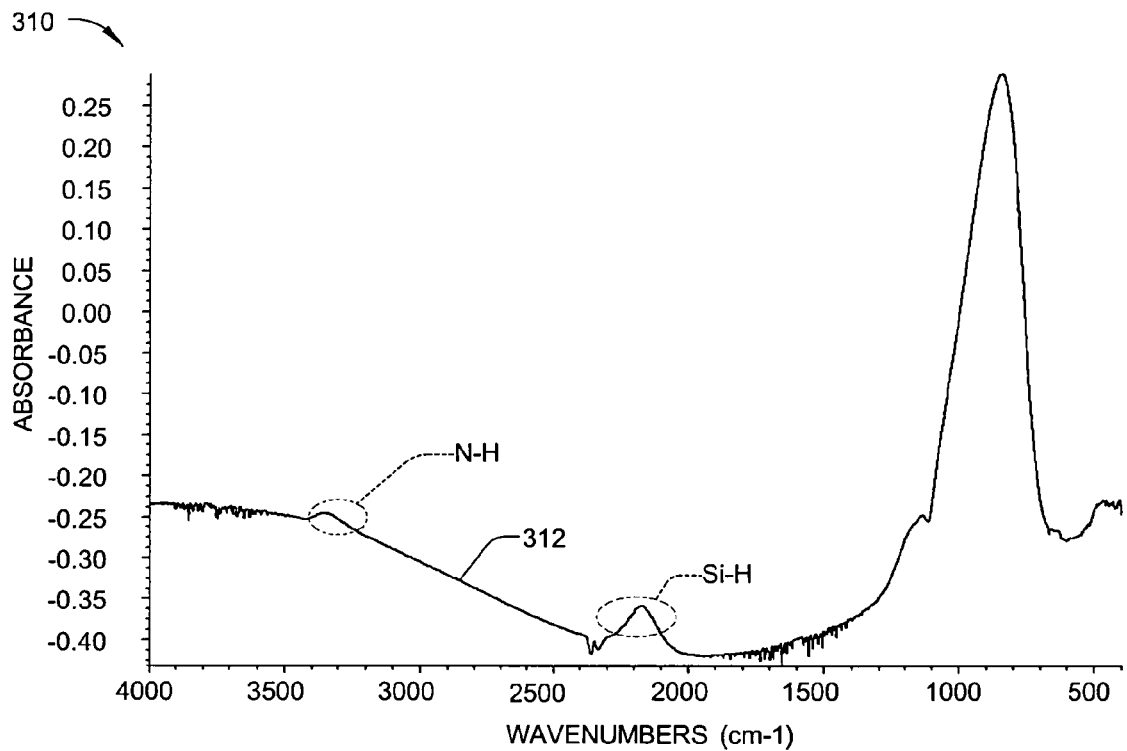
FIGS. 8A and 8B are FTIR spectra plots illustrating infrared absorbance for conventional high silicon-hydrogen SiN layers.
Figure 8B:
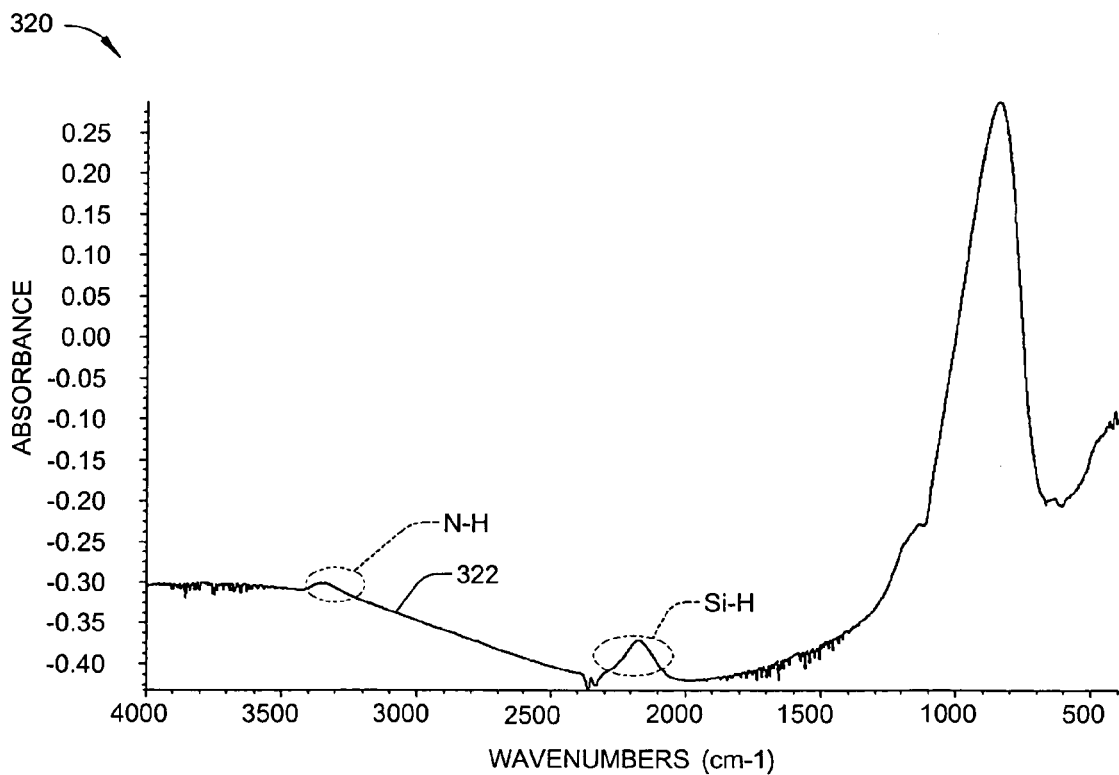

FIGS. 6–8B further illustrate the advantages of and exemplary techniques for measuring or characterizing the low Si—H silicon nitride materials 112 of the present invention. FIG. 6 illustrates an exemplary FTIR plot 300, showing an infrared absorbance or absorption spectra 302 for a low silicon-hydrogen SiN layer in accordance with the invention (e.g., layer 112 in the device 102 above). FIG. 7 further illustrates a portion of the plot 300 of FIG. 6, showing one possible technique for determining a figure of merit for a low silicon-hydrogen SiN layer in accordance with the invention. FIGS. 8A and 8B provide FTIR spectra plots 310 and 320 illustrating infrared absorbance for conventional high silicon-hydrogen SiN layers (e.g., having figures of merit greater than 0.05).

As used herein, the FTIR figure of merit for the low silicon-hydrogen SiN materials of the invention relates the relative amounts of silicon-hydrogen (Si—H) and nitrogen-hydrogen (N—H) in the deposited SiN. It is believed that the hydrogen content of the low silicon-hydrogen SiN materials of the invention has a lower tendency to dissociate than in conventional SiN materials in which the hydrogen content is largely bonded with silicon, because Si—H bonds are of lower bond energy (e.g., about 3.34 eV) than are N—H bonds (e.g., about 4.05 eV).

FTIR spectra may be used to provide a figure of merit (FOM) or value used in ascertaining the relative amounts of silicon-hydrogen (Si—H) and nitrogen-hydrogen (N—H) in a SiN material. FTIR spectroscopy is the study of the interaction of infrared (IR) radiation with a sample, such as a wafer with a deposited SiN layer, to measure the frequencies at which the sample absorbs such radiation, as well as the intensity of the absorption. This type of measurement allows identification of the chemical composition of the sample (e.g., of the deposited SiN material), because chemical functional groups, such as SiN, Si—H, N—H, etc., are known to absorb IR radiation at specific frequencies, wherein the intensity of the absorption at a certain frequency or frequency band is related to the concentration of the corresponding component. In typical FTIR spectra plots, such as the exemplary plot 300 in FIGS. 6 and 7, the frequency (X axis) is generally depicted in terms of wavenumbers in units of cm$^{-1}$.

For the exemplary low hydrogen-silicon SiN material corresponding to the Plot 300 in FIGS. 6 and 7, a large peak is found, that is centered at around 900 cm$^{-1}$, corresponding to SiN. It is known that Si—H absorption will appear in the wavenumber range of 2050–2350 cm$^{-1}$, and that N—H absorption is found in the wavenumber range of 3200–3425 cm$^{-1}$, as shown by the circled portions of the absorption spectra 302. It is further assumed that Si—H bonds in SiN have about 1.4 times the specific absorption of N—H bonds, which is believed to be due to the corresponding difference in bond energies. The absorption intensity at these bands of interest can be quantified in terms of the area under the peaks, which may be computed or calculated using any suitable technique within the scope of the invention. The ratio of the areas for Si—H and N—H is then determined and divided by the scaling factor 1.4 (e.g., Si—H/1.4N—H) to obtain the figure of merit, wherein the low silicon-hydrogen SiN materials of the present invention have an FTIR figure of merit of about 0.05 or less, such as 0.04 or less in one example, and about 0.03 or less in another example.

One possible technique for obtaining the relevant area measurement from the FTIR spectra 302 is illustrated in FIG. 7, wherein a line 304 is drawn beneath the peak (e.g., local maxima) of interest (e.g., N—H in FIG. 7). The wavenumber (e.g., frequency) at which the peak occurs is identified as 'v', and the corresponding intensity value 'I' is identified (e.g., I=−0.092 in this example). A corresponding intensity value $I_0$ is determined as the intensity of the line 304 at the frequency v (e.g., $I_0$=−0.114 in this example). Using these intensity values, a third intensity I' is determined as the square root of the product I and $I_0$ (e.g., I' is the square root of ((−0.092)×(−0.114))=0.1024 in this example). A line 306 is then drawn parallel to the line 304, so as to intersect the frequency v and the intensity value I'. The frequency values at which this line 306 crosses the spectra 302 are subtracted to obtain a value Δv (e.g., =about 110 cm$^{-1}$ in this example). The area corresponding to the N—H peak is then determined as 'A' times Δv, where A=$\log_{10}$ of $I_0$/I=0.0931, resulting in an area of about 10.243.

A similar technique can be employed to find the area under any peak for Si—H, and the ratio of the areas is divided by 1.4 (e.g., Si—H/1.4N—H) to obtain the FTIR figure of merit. As can be seen in the FTIR spectra 302 in FIGS. 6 and 7, most of the hydrogen in the low silicon-hydrogen SiN is involved in N—H bonds, whereby the hydrogen is less likely to dissociate during thermal processing of a semiconductor device wafer. In this manner, the low silicon-hydrogen SiN is less likely to act as a source of hydrogen to ferroelectric capacitors or transistors than are SiN films having high silicon-hydrogen content. Furthermore, the employment of PECVD deposition techniques using high $N_2$ flow and low ammonia flow for forming the low silicon-hydrogen SiN provides more conformal coverage, particularly along the lateral sidewalls of capacitor and transistor structures, thereby providing a better barrier against hydrogen diffusion than conventional HDP SiN deposition techniques. As seen in Table 1 above, the figure of merit for the exemplary low silicon-hydrogen SiN materials of the invention is about 0.05 or less. This is exemplified in the Plot 300, wherein the spectra curve 302 is basically smooth in the Si—H band of wavenumbers 2050–2350, indicating little or no absorption. Consequently, the material has little or no Si—H, but relatively high amounts of N—H.

Referring also to FIGS. 8A and 8B, the inventors have found that conventional high silicon-hydrogen SiN materials typically yield a corresponding FTIR figure of merit of about 0.8 or more. FIG. 8A illustrates a first plot 310 with an FTIR spectra 312 having a significant peak absorbance for the Si—H band at 2050–2350 cm$^{-1}$, and a relatively smaller peak absorbance for the N—H band at 3200–3425 cm$^{-1}$. The same is true in FIG. 8B, where a plot 320 is provided for an FTIR spectra 322. In this example, the spectra 322 similarly indicates a high absorbance for Si—H and relatively lower absorbance for N—H, wherein a large amount of hydrogen is contained in weaker Si—H bonds, therefore being more likely to dissociate at temperature, leading to ferroelectric PSW degradation and/or to NBTI problems for device transistors.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A semiconductor device, comprising:
    a ferroelectric capacitor formed above a semiconductor body; and
    a hydrogen barrier formed along at least a portion of a side of the ferroelectric capacitor, the hydrogen barrier comprising:
    a nitrided aluminum oxide material formed along at least a portion of the side of the ferroelectric capacitor; and
    a silicon nitride layer formed over the nitrided aluminum oxide material, wherein the silicon nitride layer comprises:
        a first silicon nitride layer formed over at least a portion of the nitrided aluminum oxide material; and
        a second silicon nitride layer formed over at least a portion of the first silicon nitride layer, the second silicon nitride layer comprising a low silicon-hydrogen SiN material having an FTIR figure of merit value of about 0.05 or less, wherein the FTIR figure of merit is calculated as (Si—H absorbance)/(N—H absorbance×1.4).

2. The semiconductor device of claim 1, wherein the low silicon-hydrogen SiN material has an FTIR figure of merit value of about 0.04 or less.

3. The semiconductor device of claim 1, wherein the low silicon-hydrogen SiN material has an FTIR figure of merit value of about 0.03 or less.

4. A semiconductor device, comprising:
- a ferroelectric capacitor formed above a semiconductor body;
- an aluminum oxide material formed along at least a portion of a side of the ferroelectric capacitor;
- a first silicon nitride layer formed over at least a portion of the aluminum oxide material; and
- a second silicon nitride formed layer over at least a portion of the first silicon nitride layer, the second silicon nitride layer comprising a low silicon-hydrogen SiN material having an FTIR figure of merit value of about 0.05 or less, wherein the FTIR figure of merit is calculated as (Si—H absorbance)/(N—H absorbance×1.4).

5. The semiconductor device of claim 4, wherein the low silicon-hydrogen SiN material has an FTIR figure of merit value of about 0.04 or less.

6. The semiconductor device of claim 4, wherein the low silicon-hydrogen SiN material has an FTIR figure of merit value of about 0.03 or less.

7. The semiconductor device of claim 4, wherein at least a portion of the oxide material is nitrided.

8. A hydrogen barrier for protecting ferroelectric capacitors in a semiconductor device, comprising:
- an aluminum oxide material formed along at least a portion of a side of a ferroelectric capacitor;
- a first silicon nitride layer formed over at least a portion of the aluminum oxide material; and
- a second silicon nitride layer formed over at least a portion of the first silicon nitride layer, the second silicon nitride layer comprising a low silicon-hydrogen SiN material having an FTIR figure of merit value of about 0.05 or less, wherein the FTIR figure of merit is calculated as (Si—H absorbance)/(N—H absorbance×1.4).

* * * * *